United States Patent [19]

Angelopoulos et al.

[11] Patent Number: 5,382,637
[45] Date of Patent: Jan. 17, 1995

[54] SOLID STATE CHAIN EXTENSION POLYMERIZATION BETWEEN LEWIS ACID OLIGOMERS AND DEBLOCKED LEWIS BASES

[75] Inventors: Marie Angelopoulos, Briarcliff Manor; Claudius Feger, Hopewell Junction, both of N.Y.; Jeffrey D. Gelorme, Hartford; Jane M. Shaw, Ridgefield, both of Conn.

[73] Assignee: International Business Machines Corporation, Armonk, N.Y.

[21] Appl. No.: 785,734

[22] Filed: Oct. 31, 1991

[51] Int. Cl.$^6$ .................. C08L 77/00; C08L 79/08
[52] U.S. Cl. .................. 525/436; 522/146; 522/168; 525/420; 525/434; 528/335; 528/353
[58] Field of Search .................. 525/436, 434, 420; 522/146, 168; 528/353

[56] References Cited

U.S. PATENT DOCUMENTS

| | | | |
|---|---|---|---|
| 4,481,339 | 11/1984 | Bolon | 525/424 |
| 4,719,267 | 1/1988 | Rizk et al. | 523/453 |
| 4,728,697 | 3/1988 | Bolon et al. | 525/424 |
| 4,810,613 | 3/1989 | Osuch et al. | 430/192 |
| 4,832,808 | 5/1989 | Buchwalter | 204/181.7 |
| 4,837,124 | 6/1989 | Wu et al. | 430/270 |

Primary Examiner—Ana L. Carrillo
Attorney, Agent, or Firm—Heslin & Rothenberg

[57] ABSTRACT

A solid state chain extension method provides for the formation of a solid state film comprised of a high molecular weight polymer by chain extending a deblocked Lewis base with Lewis acid oligomers while the reactants are in a solid state form. In one embodiment, a negative resist is prepared by selectively exposing regions of the solid state film. The Lewis base is deblocked at the exposed regions by a suitable deblocking means. The Lewis acid oligomers and the deblocked Lewis base chain extend at the exposed regions. Development of the film removes the non-polymerized reactants. Optionally, the Lewis acid oligomers, when radiation-cross-linking, are cross-linked with one another prior to deblocking the Lewis base to form a negative resist. The cross-linked oligomers polymerize with the subsequently deblocked base to provide a high molecular weight polymer film. In an alternative embodiment, a positive resist is used by degrading and removing phot-sensitive Lewis acid oligomers using selective exposure lithography techniques and, subsequently, deblocking the Lewis base and chain extending the remaining oligomers with the deblocked Lewis base at the unexposed regions.

11 Claims, 6 Drawing Sheets

SOLID STATE CHAIN EXTENSION POLYMERIZATION BETWEEN LEWIS ACID OLIGOMERS AND DEBLOCKED LEWIS BASES

TECHNICAL FIELD

The present invention relates generally to chain extension methods to form high molecular weight polymers and, more particularly, to solid state chain extension polymerizations between Lewis acid oligomers and Lewis bases. Solid state as used herein essentially describes a solvent-free environment, but is further defined in more detail below. The solid state chain extension method of the present invention is useful in preparing films for semiconductor devices where the film is patterned using lithographic processes and in film coating technology wherein it is desirable to have a high solids content in the coating solution in order to achieve improved planarization.

BACKGROUND ART

Generally, materials which are suitable as high temperature stable permanent resists are comprised of high molecular weight polymers. Such films must be capable of having a preselected pattern formed therein (i.e., by lithographic patterning/etching) with either exposed or unexposed regions being soluble in a solvent while the other of the exposed or unexposed region being relatively insoluble in the solvent. In addition, such films including interlayer dielectric films must have inherently good mechanical properties. Good mechanical properties are characterized by high modulus, high elongation at break and low tendency to exhibit solvent induced (environmental) crazing and/or cracking. High molecular weight long chain polymers usually exhibit better mechanical properties then their low molecular weight analogs. However, high molecular weight unfavorably influences other important characteristics of good resist materials, such as solvent diffusion rate, speed of dissolution, contrast, resolution, and line profile.

In general, materials with good lithographic properties exhibit high sensitivity to radiation such as optical light (ultraviolet and/or visible), electron beam (e-beam), x-ray, or ion-beam radiation and have a significant solubility differential between exposed and unexposed regions. High contrast is identified by the existence of a sharp solubility difference observed for a very narrow dose range. A film having a high contrast minimizes the deleterious effects caused by the scattering of radiation in the resist film. In addition, good lithographic materials exhibit a minimum amount of swelling and are capable of high resolution.

For optimum lithographic performance low molecular weight polymers are preferred over their high molecular weight analogs because the former offer advantages with respect to their solubility differential and their speed of dissolution. Low molecular weight materials exhibit higher contrast and subsequently higher resolution than high molecular weight materials.

Oligomers, however, exhibit poorer mechanical properties than their high molecular weight analogs because the shorter chains do not allow viscoelasticity dissipation of significant amounts of energy, thus causing the films to become brittle. For this reason, oligomers generally are not used as permanent resist films for semiconductor devices, even though they offer superior permanent resist lithographic properties than higher molecular weight materials, as discussed above.

The practitioner who desires to apply a film to a substrate is also aware of the need for the film to have good planarization and low viscosity. It is frequently difficult to find a material exhibiting both good planarization and a low viscosity in solution because high planarization requires the solution to have a high solids content which even for oligomers tends to increase the viscosity. It is known in the art that the higher the solids content of a solution, the higher the solution viscosity. Therefore, a balance must be reached for good planarization and low viscosity.

Generally, the % planarization of a coating is described by:

$$100 \times \frac{h_1 - h_2}{h_1} = \% \text{ Planarization} \qquad (1)$$

where $h_1$ and $h_2$ are height values represented in schematic FIG. 5. Where $h_2$ is zero, the planarization is 100%. A film with 100% planarization is most desirable. If 100% planarization is reached after spinning the film, shrinkage accompanying the subsequent drying process will lead to a smaller decrease in the percent of planarization when the solvent content is lower because the solids content is higher.

Typically, high molecular weight polymers have a planarization value of approximately 30%. An increase in the planarization value by increasing the solids content is generally not a viable option because a solution containing more than 20% solids of a high molecular weight polymer, such as polyamic acid, a polyimide precursor, will be too viscous for the known procedures of depositing the film such as spinning or spraying the solution. Therefore, solutions of high molecular weight polymers have limitations with respect to the acheivable planarization and viscosity values.

Solutions consisting of oligomers, however, have much lower solution viscosities. The solids content of said solutions can, therefore, be increased substantially without reaching the limits of the processability. High planarization values are attainable with oligomers. This advantage, however, cannot usually be exploited due to the poor mechanical properties exhibited by oligomer films.

To avoid the difficulties arising from the high molecular weight of linear macromolecules, and still obtain good mechanical properties, resist technology has relied on using cross-linking systems in which mixtures of relatively low molecular weight, reactive molecules are combined with radiation-sensitive reagents which start the cross-linking reaction upon exposure. Cross-linking processes like these eventually provide very high molecular weight polymers and with acceptable mechanical properties.

Despite the success of resists based on cross-linking systems, two major areas are in need of improvement. First, cross-linked systems tend to be highly brittle due to the high cross-link densities reached with the low molecular weight starting molecules. Secondly, most of the materials available in this area are thermally stable only to intermediate temperatures rarely exceeding 250° C.

Linear macromolecules usually show much better impact resistance, i.e., they are much less brittle. However, as pointed out above, the shortcomings of high molecular weight polymers for resist applications substantially limit their use.

In general, there is no teaching in the art which provides for a method of using a high molecular weight polymer to prepare a film and which simultaneously avoids compromising the best planarization, mechanical and lithographic properties.

DISCLOSURE OF THE INVENTION

The need for a new method for preparing such a film is satisfied in accordance with the principles of the present invention by providing a chain extension method comprising the steps of providing a substantially solvent-free film comprised of a substantially uniformly intermixed Lewis acid oligomer and a protected Lewis base; and deblocking said protected Lewis base to form a deblocked Lewis base permitting said deblocked Lewis base to react with said Lewis acid to form a polymer body comprising a chain extended high molecular weight polymer.

Solid state with regard to a polymer is defined as any viscoelastic state of the polymer in which the storage modulus exceeds the loss modulus. For the purpose of this invention the definition is narrowed to the state in which at least short range motions are still possible. This includes systems which might be above and below the glass transition. The mobility may or may not be influenced by the deblocking molecule which may or may not induce local or macroscopic plasticization. In any case, solid state includes all states in which the deblocked reactive Lewis base will immediately or after a temperature increase have enough mobility to react with the present Lewis acid.

In one aspect of the present invention, a solid state chain extension method is provided comprising the steps of: situating a solid state film comprised of Lewis acid oligomers and a protected Lewis base on a substrate; deblocking said Lewis base; and chain extending said Lewis acid oligomers with said deblocked Lewis base in the solid state to form a high molecular weight polymer film.

In addition, a solid state chain extension method for preparing a negative resist is disclosed comprising the steps of: situating a solid state film comprised of Lewis acid oligomers and a protected Lewis base on a substrate; selectively exposing regions of the film to create a desired pattern comprised of exposed and unexposed regions; deblocking said Lewis base at said exposed regions; chain extending said Lewis acid oligomers with said deblocked Lewis base in the solid state to form a high molecular weight polymer film at said exposed regions; and removing non-chain extended Lewis acid oligomers and Lewis base from the unexposed regions.

An alternative solid state chain extension method is further disclosed using a negative oligomeric resist comprising the steps of: situating a solid state film comprised of radiation cross-linkable Lewis acid oligomers and a protected Lewis base on a substrate; selectively exposing regions of the film to create a desired pattern comprised of exposed and unexposed regions; cross-linking said radiation-cross-linkable Lewis acid oligomers at said exposed regions; removing non-cross-linked Lewis acid oligomers from the unexposed regions; deblocking said Lewis base; and chain extending said cross-linked Lewis acid oligomers with said deblocked Lewis base in the solid state to form a high molecular weight polymer film at the exposed regions.

A further alternative method is disclosed wherein a solid state chain extension method using a positive oligomeric resist comprises the steps of: situating a solid state film comprised of radiation-degradable Lewis acid oligomers and a protected Lewis base on a substrate; selectively exposing regions of the film to create a desired pattern comprised of exposed and unexposed regions; degrading said radiation-degradable oligomers at said exposed regions; removing the degraded Lewis acid oligomers from the exposed regions; deblocking said Lewis base; and chain extending the remaining Lewis acid oligomers with said deblocked Lewis base in the solid state to form a high molecular weight polymer film at the unexposed regions.

It is an object of the invention to provide an improved method for fabricating high molecular weight polymer films.

It is a further object of the invention to provide a method wherein the lithographic steps take place on an oligomeric film, thus taking advantage of the superior lithographic properties exhibited by oligomers and, subsequently polymerizing the oligomers in the solid state to provide a film having desired high molecular weight polymer having the acceptable mechanical properties.

It is an advantage of the present invention to situate an oligomeric film on a substrate thereby taking advantage of the enhanced solubility of the oligomer and low viscosity of the resultant solution to obtain good planarization in films produced from such solutions having a high solids content.

It is a further advantage of the inventive method to provide an oligomeric film which will exhibit all the lithographic advantages of low molecular weight resists such as high contrast, high sensitivity, low swelling and high resolution.

It is a further advantage of the inventive method to convert the oligomeric film having the desired lithographic and planarization properties to a higher molecular weight film having better mechanical properties through chain extension methods in the solid state, subsequent to the lithographic patterning.

It is a feature of the inventive method to provide in the oligomeric film a protected Lewis base which can react in the solid state with the Lewis acid oligomers after being deprotected or deblocked to chain extend the oligomers and the Lewis base to form a high molecular weight polymer film.

BRIEF DESCRIPTION OF THE DRAWINGS

The foregoing and other objects, features and advantages of the invention will be apparent from the following more particular description of the preferred embodiments of the invention, as illustrated in the accompanying drawings.

BEST MODE FOR CARRYING OUT INVENTION

There will now be described a solid state chain extension method between Lewis acid oligomers and a deblocked Lewis base.

The polymer film prepared according to the present invention may have several embodiments, depending on the quality and type of polymers film desired.

A first type of polymer film is referred to as a planar film or planar embodiment. Using the inventive method, an essentially planar high molecular weight polymer film, sans pattern etching or lithography, may be prepared in accordance with the inventive steps as outlined in the flowchart at FIG. 1.

Figure 1:
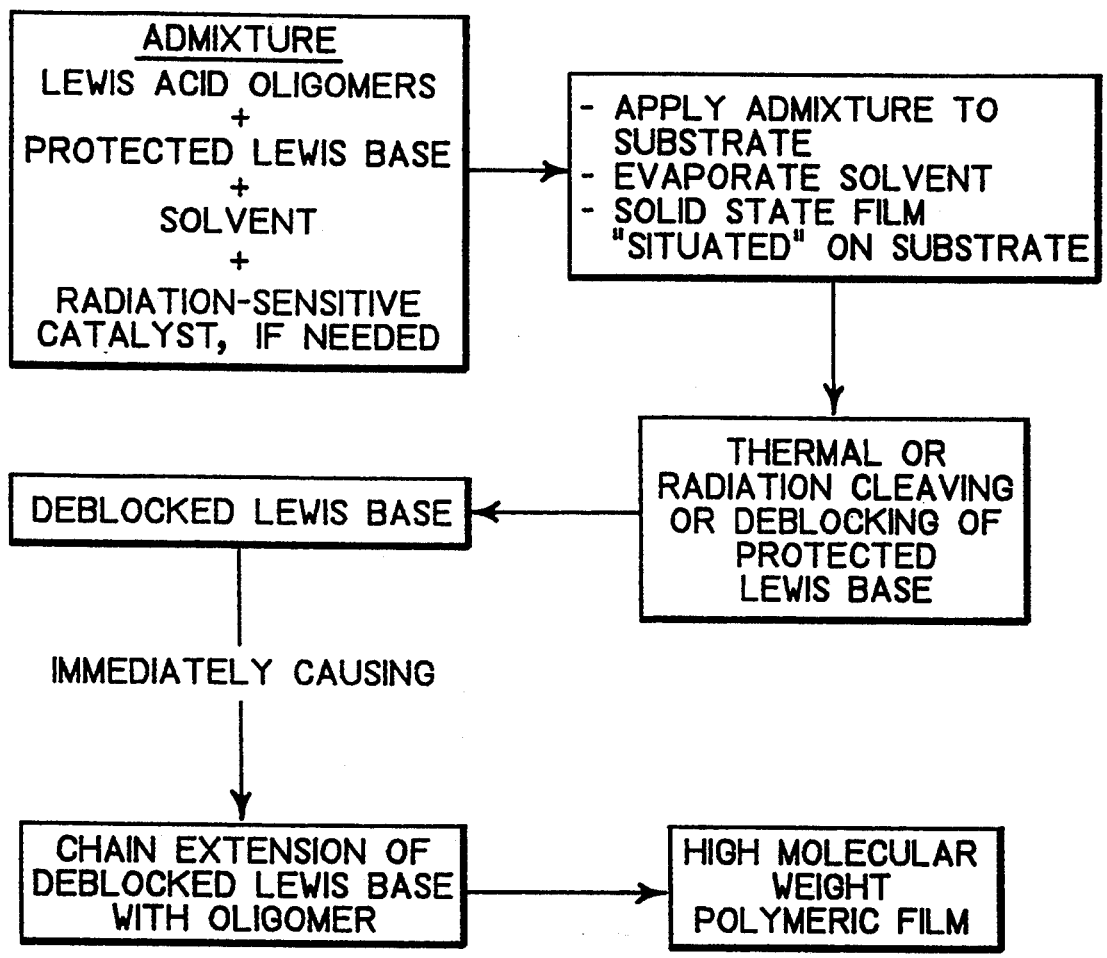
FIG. 1 is a schematic flowchart outlining the steps of the inventive method for preparing a planar high molecular weight polymer film.
Figure 5:
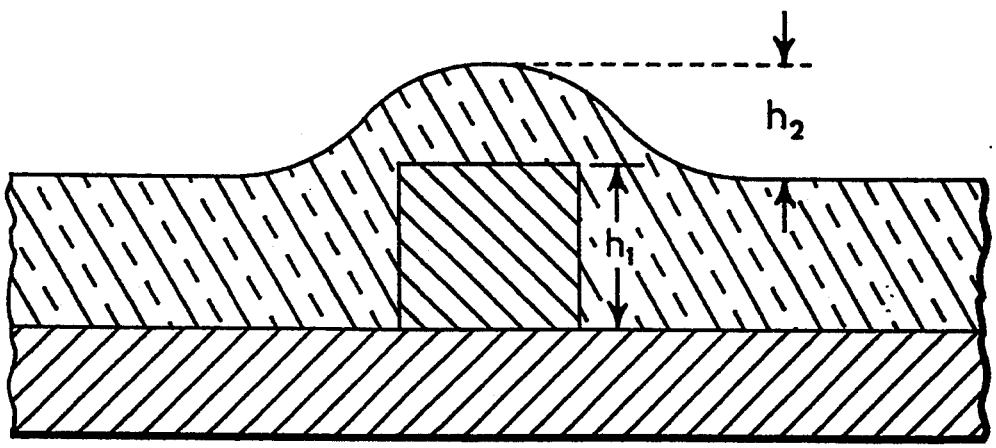
FIG. 5 is a schematic view illustrating the planarization variables for a sample film situated on a substrate having a feature thereon.

Referring now to FIG. 1, an unreacted mixture or admixture containing Lewis acid oligomers and a protected Lewis base is dissolved in an organic solvent. Suitable Lewis acid oligomers are defined herein as, oligomeric, or low molecular weight polymeric species which readily attract electrons (i.e., electrophilic) Lewis acid monomers are those monomers that readily attract electrons. Some examples of Lewis acid monomers and oligomers include, without limitation, monomers, oligomers and low molecular weight polymers containing end groups selected from the group consisting of anhydride, acid chloride, carboxylic acid, activated ester, sulfonyl chloride and carbonyl groups. Preferably, the Lewis acid oligomer is an anhydride-terminated polyimide precursor (i.e., polyamic acid) oligomer such as a biphenylene tetracarboxylic acid dianhydride (BPDA)/phenylene diamine (PDA) oligomer having repeating units of the formula,

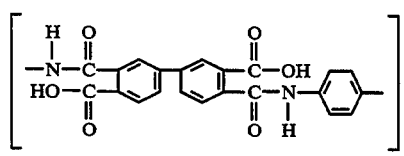

(2)

Difunctional Lewis acid oligomers are the most desirable.

A protected Lewis base is defined as an electron donating compound which has a protecting group attached thereto to prevent such electron donation until the protecting group is removed or cleaved either thermally or by use of light (ultraviolet and/or visible), x-ray, or electron or ion beam radiation collectively referred to as radiation. Cleaving of the protecting group occurs according to the following mechanism:

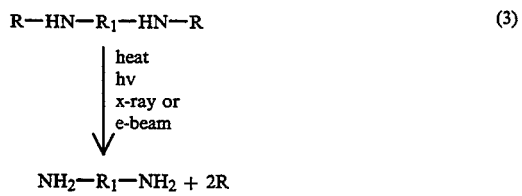

where R is the protecting group; and $R_1$ is the Lewis base.

Suitable Lewis bases represented by $R_1$ above include di, tri or multifunctional amines, such as phenylene diamine (PDA); or di, tri, or multifunctional hydroxyl group containing compounds like alcohols; di, tri, or multifunctional thiols, or any combination thereof.

Protecting groups, represented by R above can be any group which blocks the electron donating tendency of the Lewis base, but is easily cleaved by thermal or radiation processes. Where $R_1$ above has an amine functionality, typical protecting groups include, for example, carbamates such as t-butyl carbamate, l-adamatyl carbamate, vinyl carbamate, n-nitrophenyl carbamate, benzyl carbamate and nitrobenzyl carbamate; amides such as, for example, acetamides and formamides; and benzyl derivatives, for example, dimethoxylbenzylamine or nitrobenzylamines.

Where the Lewis base is a compound containing hydroxyl groups such as alcohols, the $R_1$ protecting group is, for instance, an ester, a t-butoxymethyl ether or methoxymethyl ether or tetrahydropyranyl ether; esters or carbonates, such as, benzoylformate esters.

Where the Lewis base contains a thiol, thio ether protecting groups may be used, such as benzylthio ether; thio esters, such as acetyl derivatives; and benzoyl derivatives. This list of suitable protecting groups is set forth by way of example only. Further guidance on the selection of suitable Lewis base protecting groups is available and known to those generally skilled in the art. T-butoxycarbonyl (t-Boc) and benzyloxycarbonyl groups (Benz-ox) are particularly suitable and thus, are most preferred for use as the protecting group where $R_1$ is a phenylene diamine. A t-Boc protected PDA and a Benz-ox protected PDA are represented by the formulas:

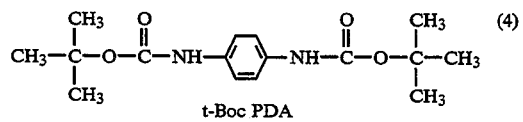

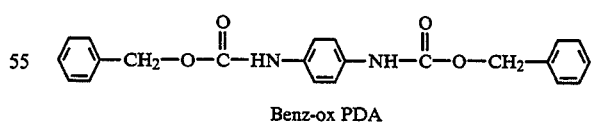

Benz-ox PDA

Due to the presence of the protecting group (R) on the Lewis base ($R_1$), the Lewis acid oligomers and the Lewis base will not react when dissolved in an organic solvent such as dimethyl sulfoxide (DMSO), dimethylformamide (DMF) or N-methylpyrrolidinone (NMP) when added together to form an admixture. This list is exemplary only and is not intended to be limiting since any organic solvent which dissolves the Lewis acid oligomers and Lewis base is suitable. The admixture will remain stable and unreacted until the Lewis base is deblocked by cleaving the protecting groups. Consequently, the admixture has a durable shelf life so long as the protecting groups are intact.

The admixture can be situated on a substrate, including a typical semiconductor substrate or upon layers situated on such a substrate or upon any surface comprised of silicon, silicide, glass, ceramic, wood or other suitable material on which it is desirable to position a high molecular weight polymer layer. Traditional methods of spinning, sputtering, dipping, spraying, coating and physically applying by blade, such as doctor blading are appropriate for situating the admixture solution, the preferred method will depend on the desired configuration of the layer.

A major advantage of the inventive method provides the practitioner with the ability to prepare an admixture with a high solids content between about 30 and 80%, and preferably between 40–60%, most preferably about 50% solids, without exceeding acceptable viscosity limits because the solution contains dissolved oligomers rather than high molecular weight polymers. A high solid content yields outstanding planarization values in excess of 80% and, consequently, reduces the shrinkage of the film during the subsequent solvent evaporation step.

Once the admixture is applied to the substrate, the substrate is heated to evaporate or partially evaporate the solvent until a film dry to the touch is obtained. Most organic solvents have a high vapor pressure and films dry to the touch can be readily obtained at drying temperatures below 100° C. At such low temperatures the Lewis base remains protected, thereby preventing a reaction with the Lewis acid oligomers. Once the film is dried, the admixture containing Lewis acid oligomers and the protected Lewis base are hereinafter defined as "situated" on the substrate in the solid state.

The Lewis base can be deblocked by applying heat sufficient to cleave the groups for a thermal deblocking. Where a t-Boc protecting group is used, the protecting group is thermally cleaved at about 190° C.

The t-Boc protecting group may also be cleaved by radiation using an acid generating catalyst and, as such, the catalyst should be added to the admixture in order to be situated in the solid film on the substrate. When the solid film is subjected to radiation the catalyst generates an acid which causes the t-Boc protecting group to cleave. Suitable acid generator catalyst include onium salts, such as sulfonium, iodonium; and triflate salts, borate salts, tosylate salts and sulfonyloxy imides.

Examples of suitable onium salts include aromatic onium salts of Group IV elements discussed in U.S. Pat. No. 4,175,972, the disclosure of which is incorporated herein by reference, and aromatic onium salts of Group Va elements discussed in U.S. Pat. No. 4,069,055, the disclosure of which is also incorporated herein by reference.

Aromatic Group IVa onium salts include those represented by the formula:

$$[(R)_a(R^1)_b(R^2)_cX]_d{}^+(MQ_e)^{-(e-f)} \qquad (6)$$

where R is a monovalent aromatic organic radical, $R^1$ is a monovalent organic aliphatic radial selected from alkyl, cycloalkyl and substituted alkyl, $R^2$ is a polyvalent organic radical forming a heterocyclic or fused ring structure selected from aliphatic radicals and aromatic radicals, X is a Group IVa element selected from sulfur, selenium, and tellurium, M is a metal or metalloid, Q is a halogen radical, a is a whole number from 0 to 3 inclusive, b is a whole number from to 0 to 2 inclusive, c is a whole number from 0 to 1, where the sum of $a+b+c$ is a value equal to 3 or the valence of X, $$d = e - f$$

where f = the valence of M and is an integer from 2 to 7 inclusive, e is greater than f and is an integer having a value of up to 8.

Radicals included by R are, for example, $C_{(6-13)}$ aromatic hydrocarbon radicals such as phenyl, tolyl, naphthyl, anthryl, and such radicals substituted with up to 1 to 4 monovalent radicals such as $C_{(10\%)}$ alkyl such as methyl and ethyl, substituted alkyl such as $-C_2H_4OCH_3$, $-CH_2COOC_2H_5$, $-CH_2COOC_2H_5$, $-CH_2COCH_3$ etc., $R^2$ radicals include such structures as:

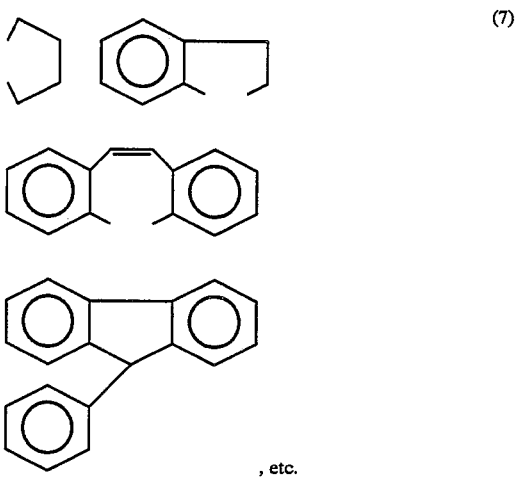

, etc.

(7)

Complex anions included by $MQ_{e-(e-f)}$ are for example, $BF_4{}^-$, $PF_6{}^-$, $SbF_6{}^-$, $FeCl_6{}^-$, $SbCl_6{}^-$, $BiCl_5{}^-$, $AlF_6{}^-$, $GaCl_4{}^-$, $InF_4{}^-$, $TiF_6{}^-$, $ZrF_6{}^-$, etc., where M is a transition metal such as Sb, Fe, Sn, Bi, Al, Ga, In, Ti, Zr, Sc, V, Cr, Mn, Cs, rare earth elements such as the lanthanides, for example Ce, Pr, Nd, etc., actinides, such as Th, Pa, U, Np, Etc. and metalloids such as B, P and As.

Group IVa onium salts are for example,

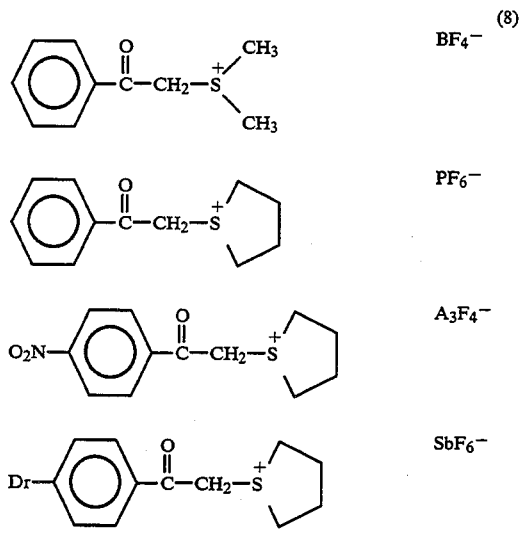

(8)

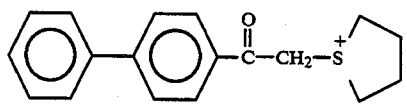 FeCl$_4^-$

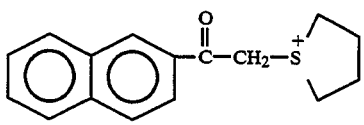 SnCl$_4^-$

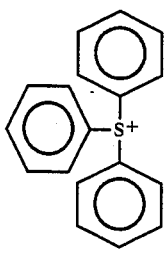 SbF$_6^-$ (9)

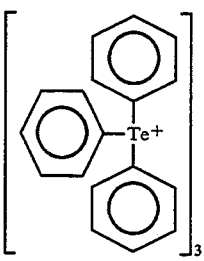 SiCl$_3^-$

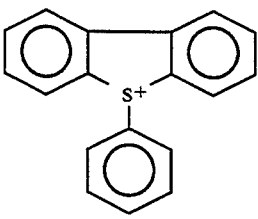 BF$_4^-$

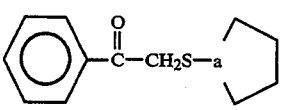 PF$_4^-$

Aromatic group Va onium salts include those represented by the formula:

$$[(R)_a(R^1)_b(R^2)_cX^1]_d^+[MQ_d]^{-(e-f)} \quad (10)$$

where R is a monovalent aromatic organic radical selected from carbocyclic radicals and heterocyclic radicals, R$^1$ is a monovalent organic aliphatic radical selected from alkyl, alkoxy, cycloalkyl and substituted derivatives thereof. R$^2$ is a polyvalent organic radical forming an aromatic heterocyclic or fused ring structure with X$^1$, X$^1$ is a Group Va element selected from N, P, As, Sb and Bi, M is a metal or metalloid, Q is a halogen radical, a is a whole number from 0 to 2 inclusive, b is a whole number from 0 to 2 inclusive, c is a whole number from 0 to 2 inclusive, and the sum of a+b+c is a value equal to 4 or the valence of X$^1$, $$d = e - f$$

where f=valence of M in an integer from 2 to 7 inclusive e is greater than f and is an integer having a value up to 8.

Radicals included by R are, for example, C$_{(6-13)}$ aromatic hydrocarbon radicals such as phenyl, tolyl, naphthyl, anthryl and such radicals substituted with up to 1 to 4 monovalent radicals such as C$_{(1-8)}$ alkoxy, C$_{(1-8)}$ alkyl, nitro, chloro and hydroxy; arylacyl radicals such as phenylacyl; arylalkyl radicals such as pyridyl and furfuryl; R$^1$ radicals include sub (1-8) alkyl, C$_{(3-4)}$ cycloalkyl, substituted alkyl such as haloalkyl, for example, choroethyl; alkoxy such as OCH$_2$C$_6$H$_5$OCH$_3$, Alkoxyalkyl such as —C$_2$COCH$_3$; alkylacyl such as —CH$_2$COOC$_2$H$_5$, ketoalkyl such as —CH$_5$COCH$_3$.

Radicals included by R$^2$ are, for example:

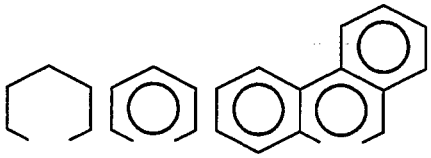 (11)

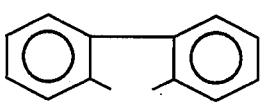

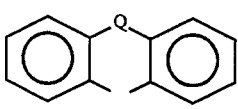

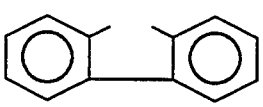

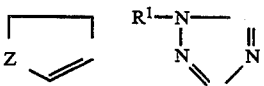

where Q is selected from O, CH$_2$, N, R, and S; Z is selected from —O—, —S— and

and R' is a monovalent radical selected from hydrogen and hydrocarbon. Complex anions included by MQ$_e$—(e-f) are, for example, BF$_4$—, PF$_6$—, AsF$_6$—, FeCl$_6$—, SbCl$_6$—, BiCl$_5$—, where M is more particularly a transition metal such as Sb, Fe, Sn, Bi, Al, Ga, In, Ti, Zr, Sc, V, Cr, Mn and Co; rare earth elements such as lanthanides, for example Ce, Pr and Nd; actinides such as Th, Pa, U and Np; and metalloids such as B, P and As.

Anions which are slightly hydrolyzed, e.g. SbF$_5$OH are considered to be the full equivalent if in the hydrolyzed form of the anion for the purposes of the present invention.

A Benz-ox protecting groups can be cleaved from the Lewis base either thermally at 210° C. or by exposure to radiation without the need for a catalyst.

Once the liberated Lewis base is deblocked, it is immediately free to react with any suitable electrophilic monomer, oligomer or polymer, thereby instantly creating a chain extension polymerization in the solid state. The oligomeric film is thus converted to a high molecular weight polymer film having desirable mechanical properties, wherein the Lewis acid oligomer and deblocked Lewis base are polymerized according to the schematic formula:

$$\text{\textendash}[\text{Lewis Acid Oligomer—Deblocked Lewis Base}]_x \qquad (12)$$

The preferred solid state polymerization occurs when a Lewis acid anhydride-terminated oligomer comprised of BPDA/PDA according to formula 2 above is polymerized with a t-Boc or Benz-ox deblocked phenylene diamine Lewis base (PDA) of formula 4 or 5 to form a high molecular weight polyamic acid film which is thermally cured to form a polyimide film.

Confirmation of the solid state polymerization of Lewis acid oligomers and a deblocked (deprotected) Lewis base according to FIG. 1 is given in Example 1 and Example 2 below.

EXAMPLE 1

Figure 6:
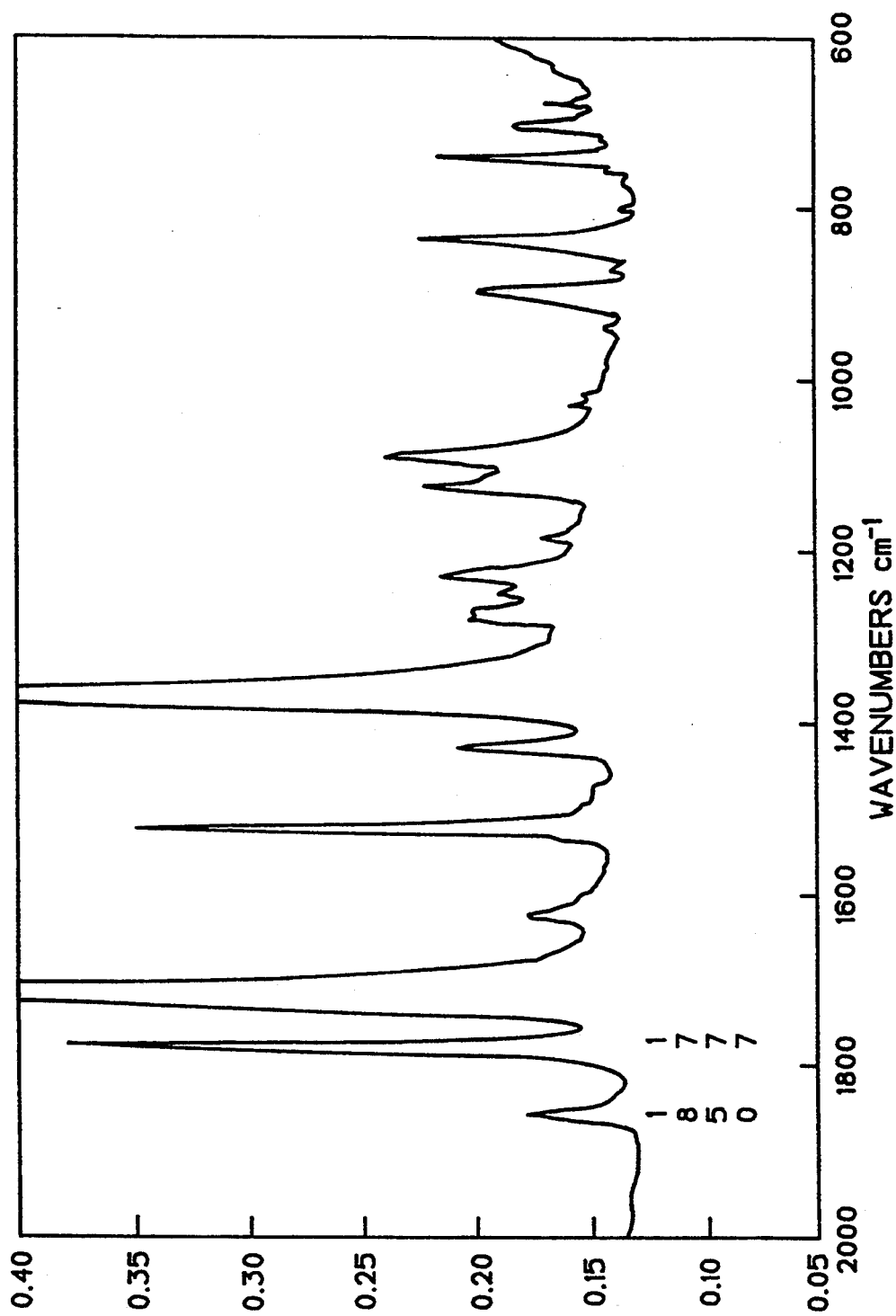
FIG. 6 is an infra-red spectra of Lewis acid polyamic acid oligomer comprised of an anhydrideterminated biphenylene dianhydride (BPDA)/phenylene diamine (PDA)
Figure 7:
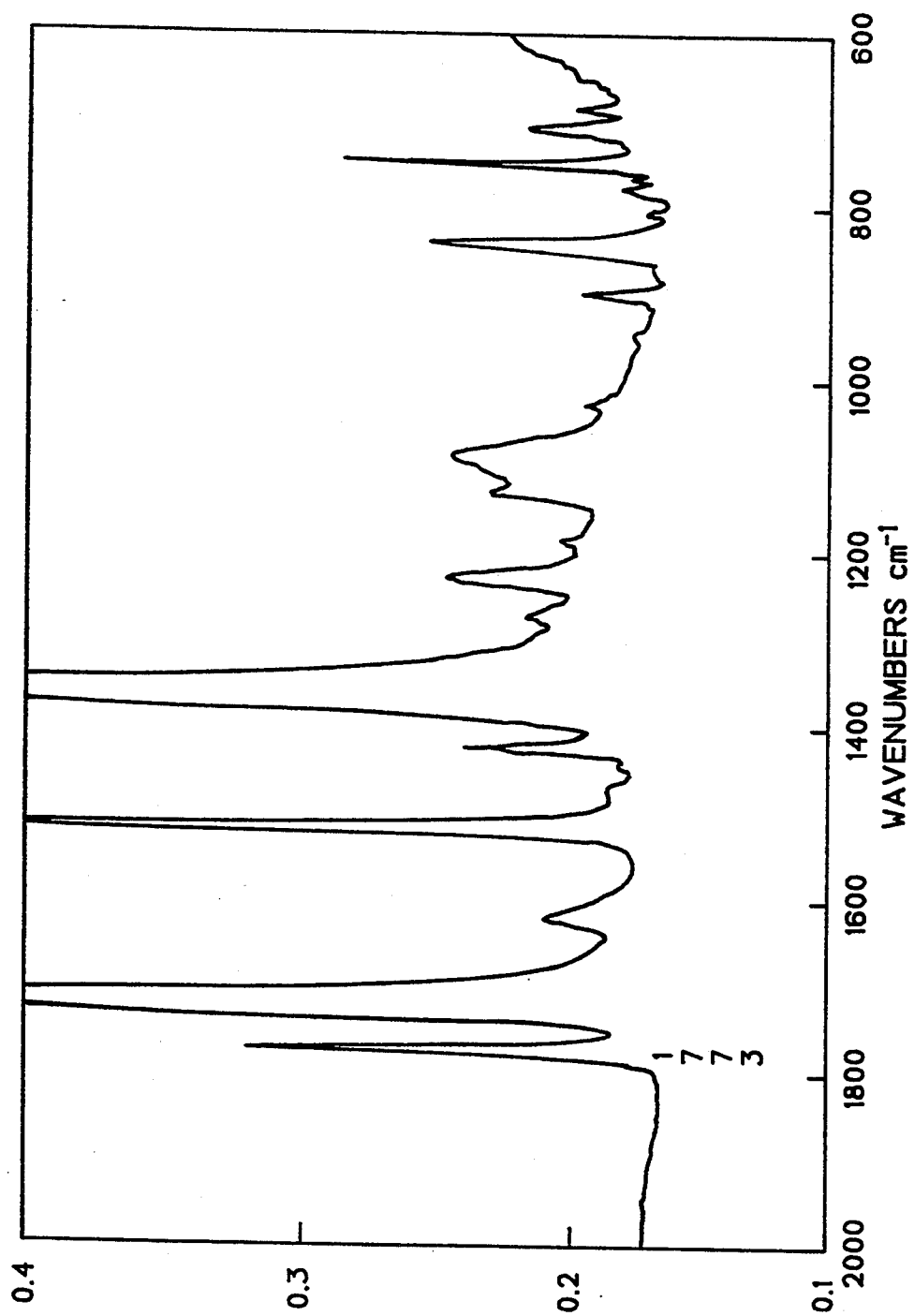
FIG. 7 is an infra-red spectra of the polyimide polymer formed from the solid state reaction of the anhydride-terminated Lewis acid BPDA/PDA oligomer and a deprotected PDA Lewis base. The anhydride peak $1850^{cm+1}$ is no longer present.

A film of an anhydride-terminated polyamic acid comprised of BPDA and PDA was situated on a salt plate to monitor the changes in the infra-red spectra during polymerization. The oligomer has two peaks occurring at $1850^{cm-1}$ and $1777^{cm-1}$ which are characteristic of the anhydride end-group. (See FIG. 6) When a film comprised of only the anhydride Lewis acid oligomer was cured at 230° C., the anhydride peak remained unchanged at $1850^{cm-1}$. However, when a second solid state film was situated on the plate comprising the anhydride-terminated oligomer and t-Boc phenylene diamine (PDA) Lewis base and heated to 230° C., the anhydride peak at $1850^{cm-1}$ disappeared. (See FIG. 7) This resulted from the deprotection of the t-Boc groups from the phenylene diamine Lewis base, thus liberating the primary amine group, allowing it to immediately react with the Lewis acid oligomer dianhydride end-group to chain extend and form a high molecular weight polyamic acid polymer which, upon thermal curing forms a polyimide film.

EXAMPLE 2

A solid state film of the anhydride-terminated polyamic acid oligomer of Example 1, t-Boc protected PDA and a radiation-sensitive onium salt was situated on a salt plate as in Example 1. The film was exposed to ultraviolet radiation and baked at 80° C. for five minutes. The original anhydride peak at $1850^{cm-1}$ on FIG. 6 disappeared indicating that the PDA had been deblocked by reaction with the acid generated from the onium salts and the liberated amine chain extended with the anhydride-terminated oligomer to form a higher molecular weight polyamic acid polymer film, which upon thermal curing forms a polyimide film.

Figure 2:
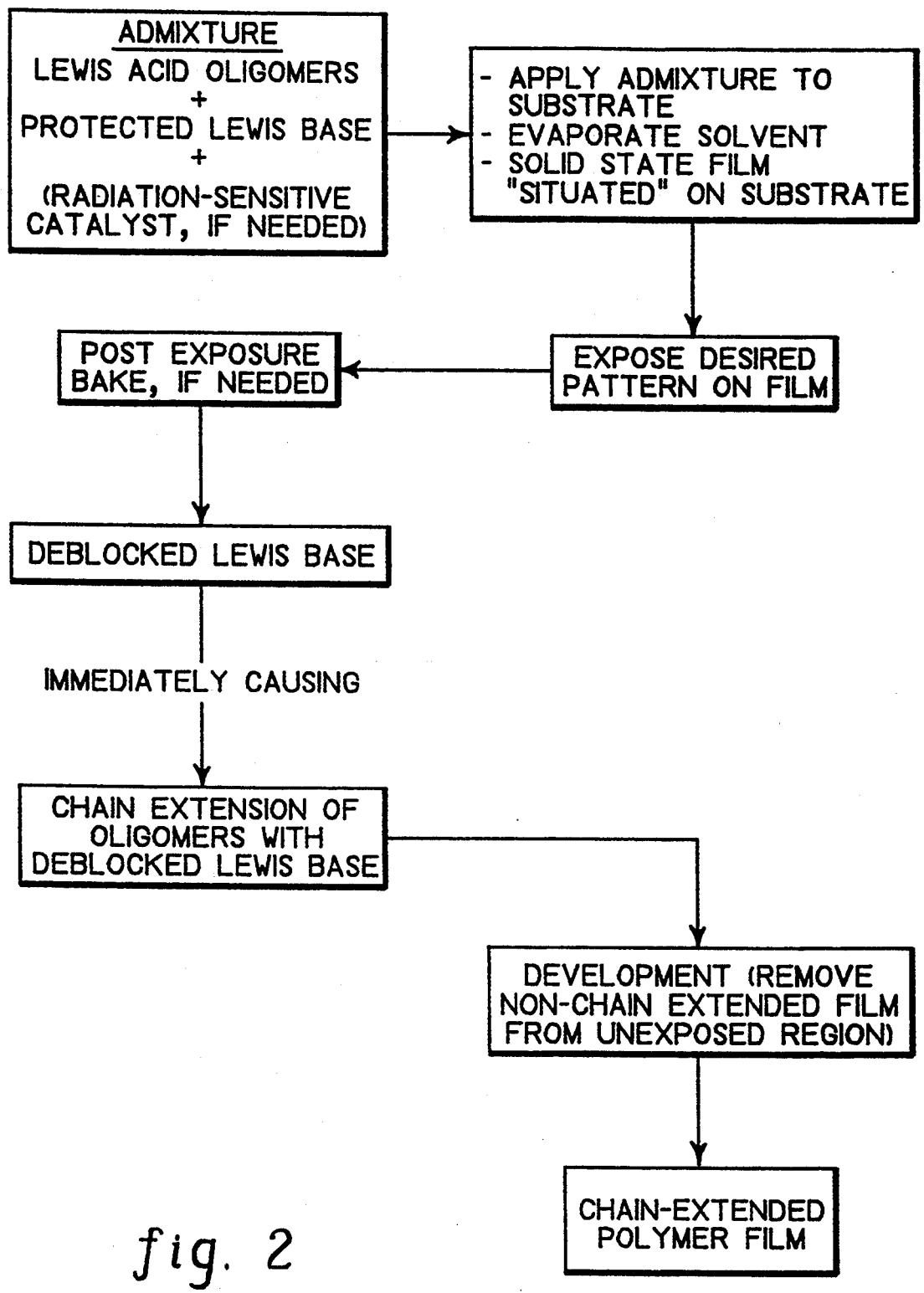
FIG. 2 is a schematic flowchart outlining the steps of the inventive method for preparing a negative resist having chain extended polymers at the exposed regions.

A negative resist may be prepared in the inventive chain extension method as outlined in the flowchart of FIG. 2.

The inventive method using a negative high molecular weight resist is outlined in FIG. 2, wherein the steps of the flowchart of FIG. 1 are repeated up to and including the preparation of the solid state film situated on a substrate. The solid film comprises Lewis acid oligomers, a protected Lewis base and, depending on the protecting group, a radiation-sensitive catalyst, if needed.

Selective exposure of regions of the solid state film is provided to create a desired pattern. Selective exposure is accomplished by either applying a mask as generally employed by those skilled in the art to the surface of the film, and subjecting the revealed regions to optical or x-ray radiation; or by applying radiation directly by electron or ion beam to the area where exposure is desired. A pattern is thereby created comprised of exposed and unexposed regions. By selectively exposing regions to radiation, the radiation-sensitive Lewis base located at the exposed regions deprotects or deblocks according to the reactions described above.

The solid state chain extension polymerization begins immediately once the Lewis base is deblocked because once the protecting groups are cleaved, the freed base is able to polymerize with the Lewis acid.

A post exposure bake of the selectively exposed film is preferably employed immediately following the selective exposure for five minutes at 80° C. The chain extension polymerization continues during the bake. The bake process does not thermally cleave remaining Lewis base protecting groups because it is conducted at a temperature which is lower than the thermal cleave temperature. Thus, the chain extension occurs only at exposed regions, where the base is free to react. The unexposed regions will still contain a protected Lewis base which is unable to react with the Lewis acid.

Chain extension polymerization of the Lewis acid oligomers and deblocked Lewis base creates a solubility differential between the polymerized polymer of the exposed regions and the more soluble unreacted oligomers and protected Lewis base of the unexposed regions. The film is developed using a solvent to remove the more soluble non-polymerized reactants of the unexposed regions. Suitable solvents include for example, dimethylsulfoxide, butyrolactone, NMP, xylene, 2-methoxyethylether and combinations and mixtures thereof.

Where the chain extended polymer is a polyamic acid precursor of polyimide, the patterned and developed solid film is preferably cured at a temperature of up to 400° C. which converts the polyamic acid to a polyimide. Curing thus improves the mechanical properties substantially.

An alternative chain extension method using a negative oligomeric resist is accomplished by achieving resist properties on a Lewis acid oligomer, and subsequently chain extending the oligomer with a deblocked Lewis base. This method is disclosed in the flow chart of FIG. 3, wherein the Lewis acid oligomers are selected for having radiation-cross-linkable side groups. It is desirable to select Lewis acid oligomers which when exposed to radiation, cross-link among themselves. Acrylate containing polyimide precursor oligomers have been used in the presence of radical initiators/sensitizers to cause such cross-linking. Other suitable cross-linkable lewis acid oligomers include a cross-linkable side chain having a carbon-carbon double or triple bond, such as acrylate groups, methacrylate groups, styrene groups, and propargyl groups.

Once the solid film containing the radiation-cross-linkable Lewis acid oligomers, protected Lewis base and catalyst initiators or sensitizers is situated on a substrate, the film is selectively exposed to a radiation source thereby creating exposed and unexposed regions as described above. At the exposed regions, the oligomers will cross-link. The Lewis base should have a protecting group such that the exposure to radiation does not cause deprotection. A standard low temperature post-expose bake is then used.

Development of the film occurs by dissolving the non-cross-linked oligomers from the unexposed regions in a solvent by either dipping, spraying, puddle developing, or similar methods. The cross-linked oligomers are insoluble in the solvent and developing the resist produces high definition patterns. After the resist development is completed the protected Lewis base located in the cross-linked oligomers is deprotected either by radiation flood exposure at a wavelength that causes deprotection or most preferably, by thermal deprotection using heat. The deblocked Lewis base will react with the reactive end groups of the cross-linked Lewis acid oligomer and thus chain extend the polymer. A post polymerization bake at 300°–400 °C. in case of polyimide precursor oligomers is recommended to burn-off the photopackage and cure the polymer.

Figure 4:
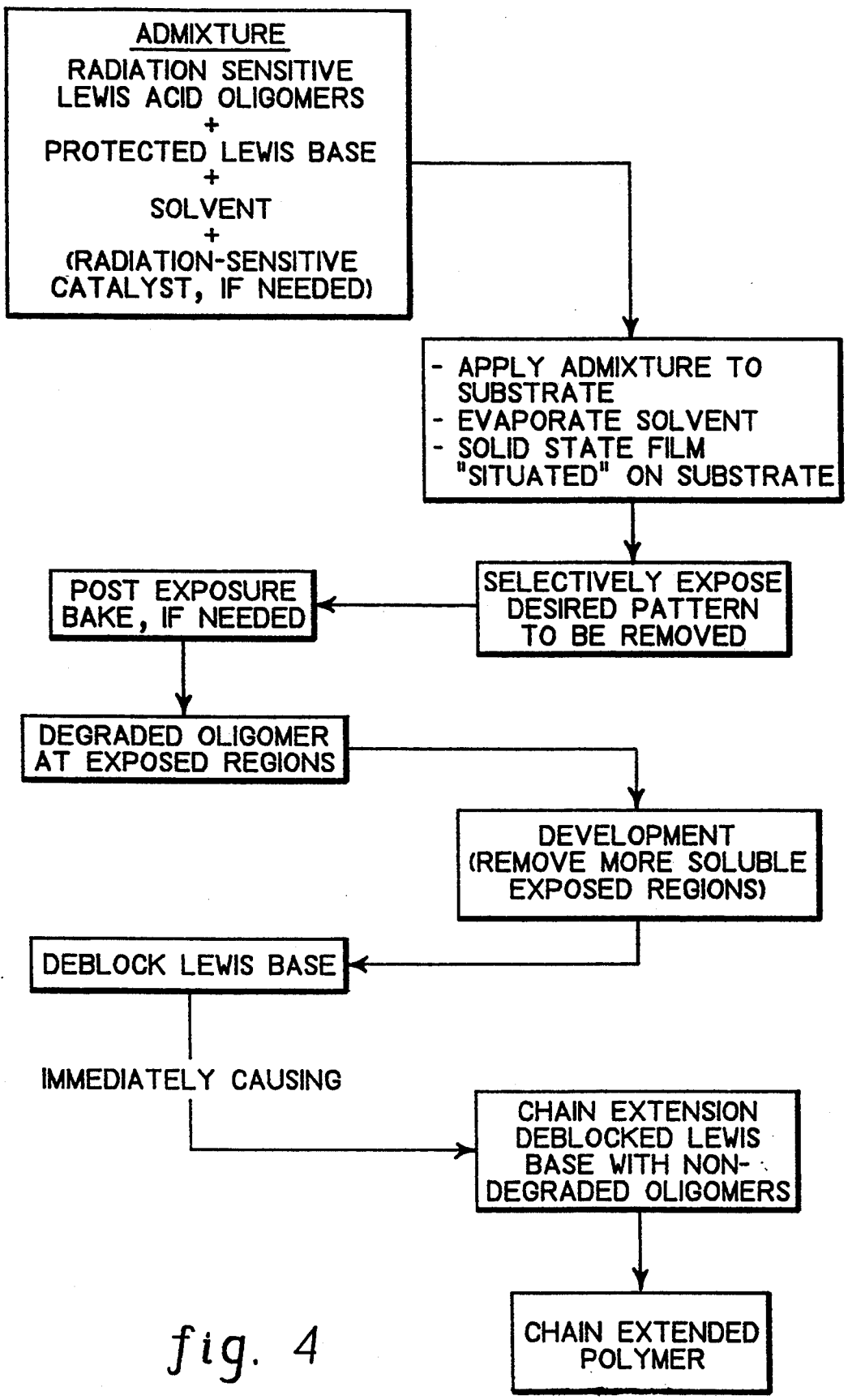
FIG. 4 is a schematic flowchart outlining the steps of the inventive method using a positive resist and having chain extended polymers at the unexposed regions.

The flowchart of FIG. 4 illustrates a solid state chain extension method using a positive oligomeric resist.

In utilizing a positive oligomeric resist the Lewis acid oligomers are selected for having qualities that will cause the radiation exposed oligomers to be more soluble than the unexposed oligomers by causing the exposed oligomers to experience degradation or chain scission upon exposure to a radiation source. Suitable degradable Lewis acids include acids having cleavable ester side chains, such as nitrobenzyl ester or tert-butyl ester or diazo-containing.

Figure 3:
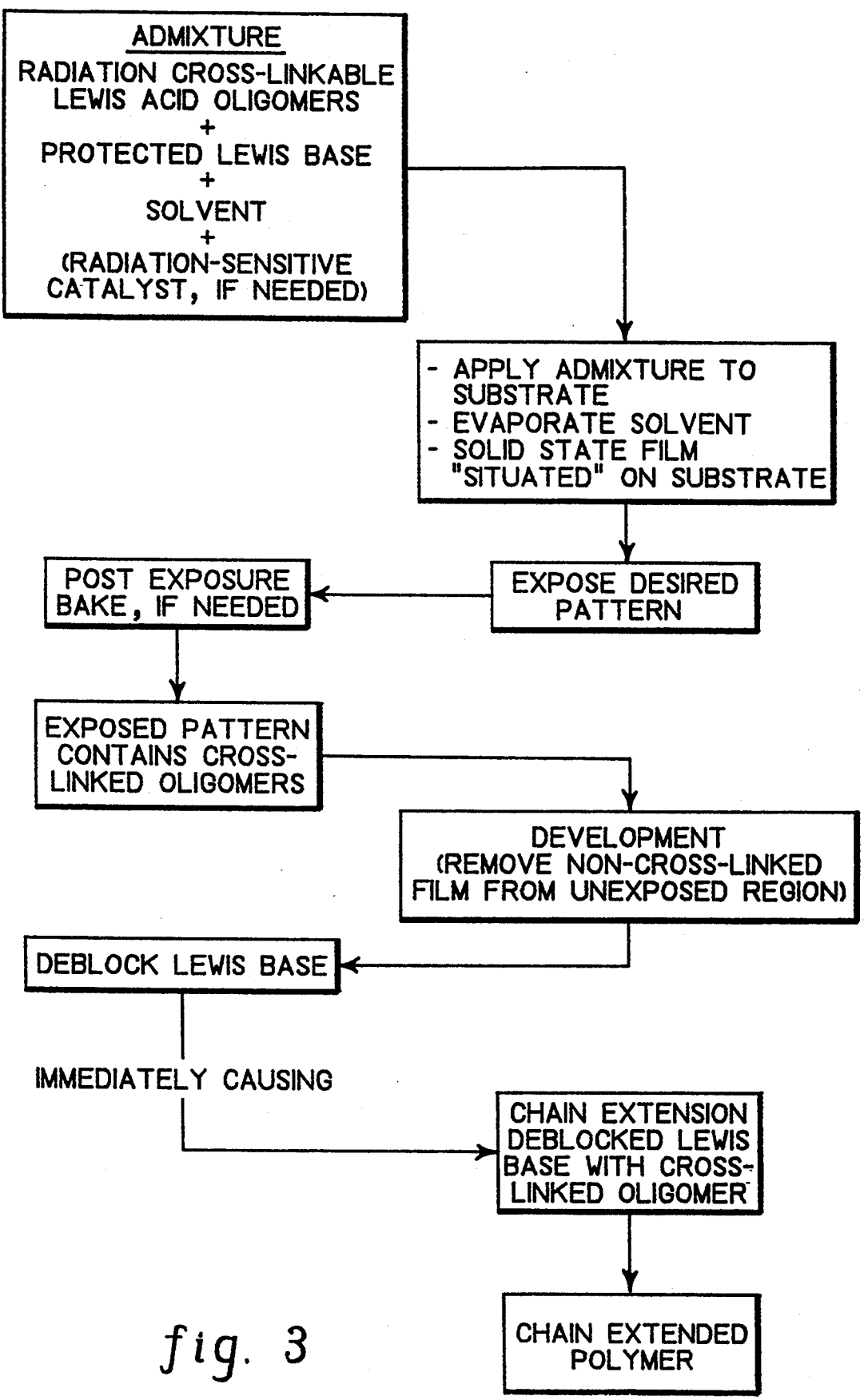
FIG. 3 is a schematic flowchart outlining the steps of the inventive method using a negative resist having cross-linked/chain extended polymers at the exposed regions.

As in the method outlined in FIGS. 1, 2, and 3, an admixture containing radiation-degradable Lewis acid oligomers and a protected Lewis base is prepared wherein the Lewis acid oligomers contain suitable radiation-degradable side groups. If the degradation reaction requires a catalyst, such catalyst is also added to the admixture. The initial steps of FIGS. 1, 2, and 3, are repeated such that the solid state film of the admixture is situated on a substrate.

The film is selectively exposed to form a desired pattern in the portion of the film that will eventually be removed. The exposure changes the solubility of the oligomer so that the exposed region becomes more soluble than the unexposed oligomer in a solvent that will neither dissolve nor swell the unexposed region.

The pattern is developed by dipping, spraying, puddle developing or similar method with a suitable solvent. After development, the Lewis base is then most preferably thermally deblocked by heat as described above, causing chain extension with the Lewis acid oligomer at the unexposed regions, thereby creating a polymer film at the unexposed regions. It is preferable to cure the film as described above, where the polymer is a polyimide precursor.

It is contemplated that, for instance, a wide variety of Lewis acid oligomers and Lewis bases would chain extend pursuant to the inventive method forming a high molecular weight polymeric film. Illustrative combinations are set forth below as a general guide to enable those skilled in the art to practice the invention.

An anhydride-terminated oligomer of pyromellitic dianhydride/oxydianiline could be used as the Lewis acid oligomers and situated in the solid state with a t-Boc protected Lewis base of oxydianiline. The t-Boc protected Lewis base could be deprotected by application of heat exceeding 190° C. causing the Lewis acid oligomer and Lewis base to immediately chain extend to form a high molecular weight polymeric film.

An oligomeric diacid chloride (1,2,4-tricarboxy benzene anhydride acid chloride) terminated amide imide and a nitrophenylcarbamate of $H_2N-(CH_2)_4-NH_2$ could be dissolved in a solvent and applied to a substrate. The solvent should be evaporated, creating a solid state film situated on a substrate. The nitrophenylcarbamate protecting group should be thermally cleaved by application of heat sufficiently high to cause the Lewis base to deblock. The deblocked Lewis base immediately reacts with the Lewis acid oligomer to form a high molecular weight polymer film.

A diisocyanate oligomeric-terminated polyurethane could be employed as the Lewis acid oligomer and situated in the solid state with a t-butoxymethyl ether of 4,4'-dihydroxy-1 benzophenone as a protected Lewis base. The t-butoxy methyl ether protecting group must be cleaved to allow the freed Lewis base to polymerize with the Lewis acid oligomer.

A dianhydride-terminated hydroxy methyl methacrylate ester of benzophenone tetracarboxylic acid (BTDA)/oxydianiline (ODA) could be situated with an acid generating catalyst of sulfonium salts in the solid state with a t-boc protected oxydianiline Lewis base. The t-Boc protecting group could be cleaved by radiation. Once the t-Boc protecting group is cleaved from the oxydianiline Lewis base, said oxydianiline Lewis base would be free to polymerize with the Lewis acid to form a high molecular weight polymer.

A diacid chloride terminated propargyl amine salt of 2,2-bis(4-amino phenyl)-hexafluoro propane (6 FDA)/2,2-bis(3,4-dicarboxyphenyl) hexafluoro propane dianhydride (6 FDA) Lewis acid could be situated on a substrate in a solid state with a nitrobenzyl protected 6 FDA Lewis base. The nitrobenzyl protecting group could be thermally cleaved allowing the 6 FDA to chain extend with the Lewis acid oligomer.

A diisocyanate-terminated t-butyl ester of biphenylene dianhydride (PBDA)/oxydianiline (ODA) Lewis acid oligomer could be situated on a substrate with a benzoyl formate ester of bisphenol A. The ester protecting group can thermally cleave by elevated temperatures causing the bisphenol A to react with the Lewis acid oligomer to chain extend to form a high molecular weight polymer.

A disilane containing anhydride-terminated polyimide oligomer Lewis acid could be situated in the solid state with a t-boc oxydianiline Lewis base. The t-boc protecting group of the oxydianyline Lewis base should be thermally cleaved at a temperature exceeding 190° C., causing the polyimide oligomer to react and chain extend with the deblocked Lewis base oxydianiline to chain extend and form a high molecular weight polymeric film.

While the invention has been particularly shown and described with reference to preferred embodiments thereof, it will be understood by those skilled in the art that various changes in form and detail of the specific configurations, steps and parameters may be made therein without departing from the spirit and scope of the invention.

Having thus described the invention enabling one skilled in the art to practice the same, what is claimed is:

1. A chain extension method comprising the steps of:
   providing a substantially solvent-free film comprised of a uniformly intermixed Lewis acid oligomer and a protected Lewis base; and deblocking said protected Lewis base to form a deblocked Lewis base permitting said deblocked Lewis base to react with said Lewis acid to form a polymer body comprising a chain extended high molecular weight polymer wherein said Lewis acid oligomer contains end groups selected from the group consisting of anhydride, acid chloride, carboxylic acid and sulfonyl chloride.

2. A chain extension method according to claim 1 wherein said substantially solvent-free polymer body has a storage modulus exceeding a loss modulus.

3. A chain extension method according to claim 1 wherein said substantially solvent-free film is sufficiently viscoelastic to permit said deblocked Lewis base to come into sufficiently close contact with said Lewis acid to chemically react therewith to form said chain extended high molecular weight polymer.

4. A method according to claim 1 wherein said Lewis acid oligomer is an anhydride-terminated polyimide precursor of biphenylene tetracarboxylic acid dianhydride/phenylene diamine having repeating units of the formula,

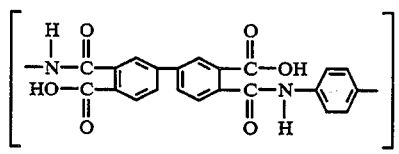

5. A method according to claim 1 where said Lewis base is selected from the group consisting of multifunctional amines, multifunctional hydroxyl group containing compounds, multifunctional thiols and any combination thereof.

6. A method according to claim 1 where said Lewis base is a phenylene diamine.

7. A method according to claim 1 where said protected Lewis base has at least one protecting group selected from the group consisting of t-butoxycarbonyl and benzyloxycarbonyl.

8. A method according to claim 1 wherein said deblocking step is accomplished by applying heat, ultraviolet light, visible light, electron-beam, ion beam or x-ray radiation.

9. A polymer film or resist prepared according to the method of claim 1.

10. A polymer film or resist prepared according to the method of claim 2.

11. A polymer film or resist prepared according to the method of claim 3.

* * * * *